(12) United States Patent
Sang et al.

(10) Patent No.: US 10,256,618 B2
(45) Date of Patent: *Apr. 9, 2019

(54) CONDUCTIVE SURFACING MATERIAL FOR COMPOSITE STRUCTURES

(71) Applicant: CYTEC INDUSTRIES INC., Woodland Park, NJ (US)

(72) Inventors: Junjie Jeffrey Sang, Newark, DE (US); Dalip Kumar Kohli, Churchville, MD (US)

(73) Assignee: CYTEC INDUSTRIES INC., Woodland Park, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/446,243

(22) Filed: Mar. 1, 2017

(65) Prior Publication Data

US 2017/0179706 A1    Jun. 22, 2017

Related U.S. Application Data

(62) Division of application No. 14/089,962, filed on Nov. 26, 2013, now Pat. No. 9,620,949.

(Continued)

(51) Int. Cl.
*H02G 13/00* (2006.01)
*H05K 9/00* (2006.01)
(Continued)

(52) U.S. Cl.
CPC ............. *H02G 13/80* (2013.01); *B32B 5/022* (2013.01); *B32B 5/12* (2013.01); *B32B 5/26* (2013.01);
(Continued)

(58) Field of Classification Search
CPC .. H02G 13/80; H05K 9/0084; B29C 37/0025; B29C 70/382; B29C 70/386; B29C 70/38; C08L 63/04

See application file for complete search history.

(56) References Cited

U.S. PATENT DOCUMENTS 5,562,788 A * 10/1996 Kitson .................. B29C 70/384
                                                                156/378
9,925,729 B2 * 3/2018 Sang ....................... B29C 70/34
(Continued)

FOREIGN PATENT DOCUMENTS

FR           2939715 A1 *  6/2010  ............. B32B 15/14

*Primary Examiner* — John L Goff, II
(74) *Attorney, Agent, or Firm* — Thi Dang

(57) ABSTRACT

An electrically conductive surfacing material capable of providing sufficient conductivity for lightning strike protection (LSP) and/or electromagnetic interference (EMI) shielding is disclosed. The conductive surfacing material is a multi-layered structure having a very thin conductive layer (e.g. solid metal foil) and a resin film formed on at least one surface of the conductive layer. The resin film is formed from a curable resin composition containing an epoxy novolac resin, a tri-functional or tetra-functional epoxy resin, ceramic microspheres, a latent amine-based curing agent, particulate inorganic fillers; and a toughening component. Optionally, the resin film further includes conductive additives to increase electrical conductivity of the surfacing material. The resin film exhibits high $T_g$ as well as high resistance to paint stripper solutions. Furthermore, the conductive surfacing material is suitable for co-curing with fiber-reinforced resin composite substrates.

7 Claims, 2 Drawing Sheets

Related U.S. Application Data

(60) Provisional application No. 61/733,597, filed on Dec. 5, 2012.

(51) Int. Cl.

| | | |
|---|---|---|
| *C08J 5/24* | (2006.01) | |
| *B32B 5/02* | (2006.01) | |
| *B32B 5/12* | (2006.01) | |
| *B32B 5/26* | (2006.01) | |
| *B32B 15/14* | (2006.01) | |
| *B32B 15/20* | (2006.01) | |
| *C08G 59/38* | (2006.01) | |
| *C08L 63/00* | (2006.01) | |
| *B32B 37/14* | (2006.01) | |
| *C09D 163/00* | (2006.01) | |

(52) U.S. Cl.
CPC .............. *B32B 15/14* (2013.01); *B32B 15/20* (2013.01); *B32B 37/14* (2013.01); *C08G 59/38* (2013.01); *C08J 5/24* (2013.01); *C08L 63/00* (2013.01); *H05K 9/0084* (2013.01); *B32B 2260/021* (2013.01); *B32B 2260/023* (2013.01); *B32B 2260/046* (2013.01); *B32B 2264/105* (2013.01); *B32B 2264/107* (2013.01); *B32B 2264/108* (2013.01); *B32B 2305/076* (2013.01); *B32B 2307/202* (2013.01); *B32B 2307/536* (2013.01); *B32B 2605/08* (2013.01); *B32B 2605/12* (2013.01); *B32B 2605/18* (2013.01); *C08L 2205/02* (2013.01); *C09D 163/00* (2013.01); *Y10T 156/1002* (2015.01); *Y10T 428/249974* (2015.04); *Y10T 428/252* (2015.01)

(56) References Cited

U.S. PATENT DOCUMENTS

| | | | |
|---|---|---|---|
| 2010/0209690 A1* | 8/2010 | Sang | B82Y 30/00 428/221 |
| 2012/0003495 A1* | 1/2012 | Cavaliere | B32B 15/14 428/596 |
| 2015/0174860 A1* | 6/2015 | Ellis | B32B 3/266 428/220 |

* cited by examiner

CONDUCTIVE SURFACING MATERIAL FOR COMPOSITE STRUCTURES

The current application is a divisional application of U.S. application Ser. No. 14/089,962 filed on Nov. 26, 2013, now U.S. Pat. No. 9,620,949, which claims the benefit of prior U.S. Provisional Application No. 61/733,597 filed on Dec. 5, 2012, both of which are incorporated herein in its entirety.

BACKGROUND

Fiber-reinforced, polymer matrix composites (PMCs) are high-performance structural materials that are commonly used in applications requiring resistance to aggressive environments, high strength, and/or low weight. Examples of such applications include aircraft components (e.g., tails, wings, fuselages, and propellers), high performance automobiles, boat hulls, and bicycle frames.

Composite structural parts for aerospace applications typically include a surfacing film to provide the required performance characteristics to the composite structures prior to painting. These surfacing films are used to improve the surface quality of the structural parts while reducing labor, time and cost. The surfacing films are usually co-cured with the fiber-reinforced polymer matrix composite materials during the manufacturing of the structural parts. Conventional epoxy-based composite prepregs and surfacing films exhibit poor resistance to electromagnetic energy (EME) events, such as lightning strike (LS), electrostatic discharge (ESD), and electromagnetic interference (EMI) due to their insulative properties. The relatively high resistivity (low electrical conductivity) exhibited by epoxies inhibits the energy of a lightning strike from dissipating adequately, resulting in skin puncture and delamination of the underlying composite structure. Further, the charge generated on the surface of the composite can remain for long periods of time, elevating the risk of ESD in low relative humidity environments that can damage electronic systems and risk sparking in the vapor space of fuel tanks. Additionally, the poor electrical conductivity of epoxy-based surfacing films may inhibit the mobility of charge carriers, which can impair the ability of the composite structure to provide EMI shielding. To minimize the damage of lightning strike on a composite structure, there is a need for enhancing the electrical conductivity of the composite structure to provide LS/ESD/EMI protection for composite parts on aircraft. It is not desirable, however, to incorporate conductive material that will significantly increase the overall weight of the aircraft. Furthermore, conventional surfacing films are not very resistant to commercial paint stripping solutions, such as benzyl alcohol-based solutions, for paint-stripping purposes. Those paint strippers can cause swelling and/or blistering of the surfacing film, thereby making the re-painting process more cumbersome. As such, there exists a need for a multifunctional, conductive surfacing material that is light-weight, can withstand repeated paint stripping using conventional paint stripping solutions, and can also withstand exposure to ultra-violet (UV) radiation.

SUMMARY

The present disclosure provides an electrically conductive surfacing material, which is a multilayered structure composed of a very thin conductive layer with a thickness of equal to or less than 3 mils (76.2 µm) and a resin film formed on at least one surface of the conductive layer. The resin film is formed from a curable, epoxy-based composition, whereby upon curing, the cured resin layer has a glass transition temperature ($T_g$) of ≥180° C., and a surface pencil hardness of greater than 7H as measured in accordance with ASTM D-3363.

The conductive surfacing material is co-curable with a fiber-reinforced polymeric composite substrate at a temperature within the range of 250° F.-355° F. (120° C.-180° C.) to form a composite structure. Furthermore, the conductive surfacing material may be used to form narrow tapes that are suitable for use in Automated Tape Laying (ATL) or Automated Fiber Placement (AFP).

BRIEF DESCRIPTION OF THE DRAWINGS

The features of this disclosure will be more readily understood from the following detailed description of the various aspects of the disclosure taken in conjunction with the accompanying drawings that depict various embodiments of the disclosure.

DETAILED DESCRIPTION

Disclosed herein is a multifunctional, electrically conductive surfacing material that is light-weight, capable of providing LS/ESD/EMI protection, can withstand repeated paint stripping using conventional paint stripping solutions, and can also withstand exposure to ultra-violet (UV) radiation. Compared to conventional conductive laminates for LS/ESD/EMI protection, the conductive surfacing material disclosed herein is capable of providing significant weight saving—50%-80% lower in weight as compared to some conventional conductive laminates.

The conductive surfacing material is a multi-layer structure which includes a very thin conductive layer and a curable resin film formed on at least one of two opposite surfaces of the conductive layer. The conductive layer may be a solid metal foil or layer, or a carbon layer. Carbon in this context includes graphite. The conductive layer preferably has a resistivity of less than 10 mΩ, more preferably, less than 5 mΩ. Moreover, the conductive layer preferably has a thickness of ≤3 mils (76.2 µm), preferably 3 µm-38 µm. The resin film may have a film weight of less than 0.1 psf (or 500 gsm), for example, 0.01-0.03 psf (or 50-150 gsm), per side. In one embodiment, the conductive surfacing material is a tri-layer structure which includes a conductive layer sandwiched between two resin films. The two resin films may have the same resin composition or different resin compositions. In one embodiment of the tri-layer structure, the conductive layer is a micro-thin metal foil having a thickness of 3 µm-5 µm, and the resin film formed on each side of the metal foil has a film weight of 0.01-0.03 psf (or 50-150 gsm). As examples, the metal layer/foil may be formed from metals such as copper, aluminum, bronze, or alloys thereof.

The conductive surfacing material may be fabricated by coating a curable, liquid resin composition onto one or both surfaces of a conductive layer (e.g. solid metal foil) using conventional coating techniques.

Alternatively, the conductive surfacing material may be fabricated by laminating a pre-fabricated resin film to one side of a conductive layer to form a bi-layer structure, or laminating two pre-fabricated resin films onto opposite surfaces of the conductive layer to form a tri-layer structure.

Figure 1:
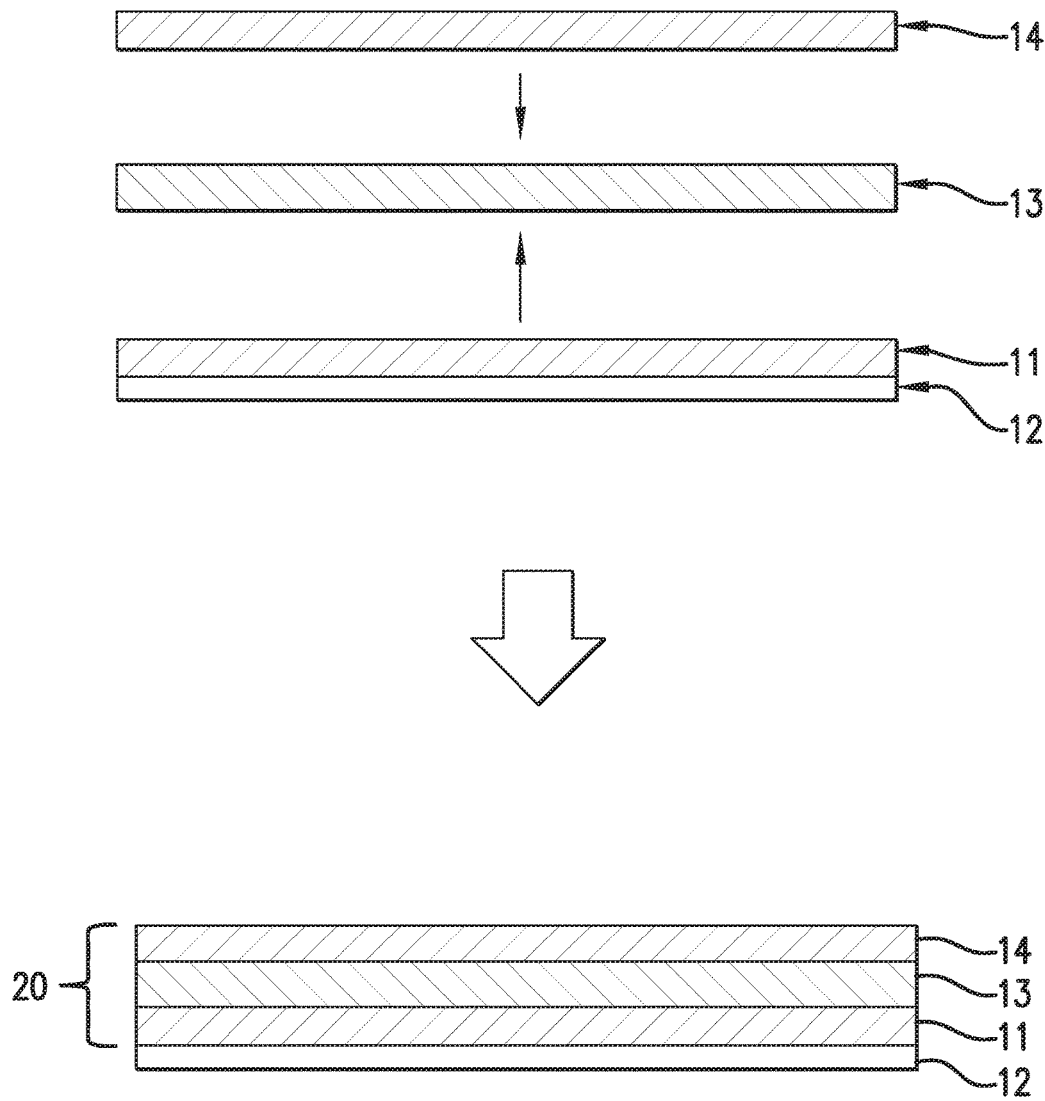
FIG. 1 schematically shows the assembly of a tri-layer conductive surfacing material according to one embodiment.

FIG. 1 schematically illustrates how a tri-layer conductive surfacing material may be fabricated according to one example. A first resin film 11, which is supported by a peel-able, release paper backing 12, is laminated onto one surface of a metal foil 13, and a second resin film 14 is laminated onto the opposite surface of the metal foil 13 to form a tri-layer structure 20. The lamination process may be carried out with the application of pressure and heat. The release paper backing 12 may be peeled off after lamination. To form a bi-layer structure, the second resin film 14 would be eliminated, and the metal foil is supported by its own peel-able carrier.

The conductive surfacing material disclosed herein is designed to be co-cured with a fiber-reinforced, polymeric composite substrate at a temperature above 150° F. (65° C.), more particularly, within the range of 250° F.-350° F. (or 120° C.-175° C.). The fiber-reinforced, polymeric composite substrate is composed of reinforcement fibers which have been impregnated or infused with a curable matrix resin. In some embodiments, the composite substrate may be a prepreg ply or prepreg layup. The prepreg layup is composed of a plurality of prepreg plies arranged in a stacking sequence. Each prepreg ply is composed of reinforcement fibers in the form of a fabric or directionally aligned, continuous fibers that have been impregnated/infused with a matrix resin, e.g. epoxy resin. The directionally aligned fibers may be unidirectional or multi-directional fibers. In general, the curable conductive surfacing material may be applied onto a fiber-reinforced, polymeric composite substrate, which is in an uncured or partially cured state, followed by co-curing to form a fully-cured composite structure having a harden surfacing film bonded thereto as the outermost layer.

Figure 2:
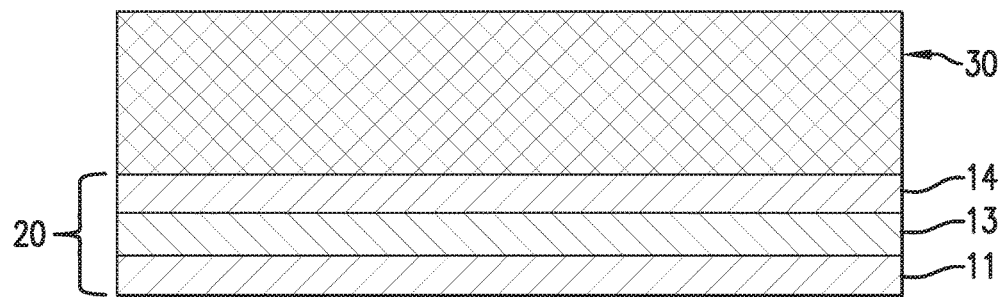
FIG. 2 schematically shows a composite structure having a tri-layer conductive surfacing material thereon according to one embodiment.

Referring to FIG. 2, to form a composite structure, the tri-layer structure 20 is brought into contact with a composite substrate 30 such that the resin film 14 is in direct contact with the composite substrate 30. In one embodiment, the composite substrate 30 is a preprep layup. In this embodiment, the paper backing 12 is peeled off and the resin film 11 is placed in contact with a tool surface, and then a plurality of prepreg plies are laid up onto the resin film 14 in a stacking arrangement. The tool surface may be planar or non-planar (e.g. curved surface or some other 3-dimensional configuration). The prepreg plies may be sequentially laid up, one on top of another, on the tool. Alternatively, the prepreg plies may be assembled at a different location and then subsequently placed onto the resin film 14. One or more core structures, e.g. foam or honeycomb structures, may be interposed between plies of the prepreg layup, as is known in the art. After debulking the whole assembly under full vacuum, the entire assembly is then subject to heat and pressure to cure the prepreg layup and the resin films of the surfacing material into a final, harden composite structure with a selected shape. When the composite structure is removed from the molding tool, the resin film 11, which was in contact with the tool surface, becomes the outmost layer of the composite structure.

The assembly in FIG. 2 may be modified by eliminating the second resin film 14 such that the metal foil 13 is in contact with the composite substrate.

The conductive surfacing material may be used to form continuous prepreg tapes suitable for use in an Automated Tape Laying (ATL) or Automated Fiber Placement (AFP) process to form a curable composite structure having the conductive surfacing material as the outermost layers. For ATL/AFP application, the conductive surfacing material may be used as is or laminated to a prepreg ply, which is composed of a curable matrix resin and fiber reinforcement in the form of unidirectional fibers or woven fabric. The conductive surfacing material or laminated prepreg ply is slit into narrow tapes with suitable AFP width (e.g., 0.125 in-1.5 in or 3.17 mm-38.1 mm, including 0.25 in-0.50 in or 6.35 mm-12.77 mm), or ATL width (e.g. 6 in-12 in or 152 mm-305 mm).

ATL and AFP are processes that use computer-guided robotics to lay one or several layers of fiber tape or tows onto a mold surface (e.g. a mandrel) to create a composite part or structure. Exemplary applications include aircraft wing skins and fuselages. The ATL/AFP process involves dispensing one or more tapes side by side onto a mandrel surface to create a layer of desired width and length, and then additional layers are built up onto a prior layer to provide a layup with a desired thickness. The ATL/AFP system is equipped with means for dispensing and compacting prepreg tapes directly onto the mandrel surface.

AFP automatically places multiple individual pre-impregnated tows or narrow slit tapes (e.g., 0.125 in-1.5 in) onto a mandrel to make up a given total prepreg bandwidth. The material placement is done at high speed, using a numerically controlled placement head to dispense, clamp, cut and restart each tow during placement. ATL machine lays down prepreg unidirectional tapes or continuous strips of fabric, which are wider than the single tows or slit tape used in AFP. Typically, with both processes, material is applied via a robotically controlled head, which contains mechanism needed for material placement. AFP is traditionally used on very complex surfaces and smaller Typical surfacing films for use with aerospace composite parts are often epoxy-based and are adversely affected when exposed to ultra-violet (UV) radiation and conventional alcohol-based paint strippers, such as benzyl alcohol-based solutions. The multifunctional conductive surfacing material disclosed herein has been designed to overcome these issues. To that end, the resin component of the resin film composition has been formulated so as to yield high $T_g$ and high cross-linked density. It has been discovered that the combination of high $T_g$ and high cross-linked density renders the resin film highly resistant to alcohol-based paint stripper solutions, such as benzyl alcohol-based solutions. To achieve these properties, the resin film composition is based on a combination of certain multifunctional resins, a polymeric toughening component to toughen the resin matrix, a latent amine-based curing agent, ceramic microspheres as a fluid barrier component, and particulate inorganic fillers as a rheology modifying component. The multifunctional resins and the ceramic microspheres make up more than 35% by weight of the total composition, preferably more than 45% by weight.

Multifunctional Resins

The resin film in the multilayer surfacing material is formed from a thermosettable composition containing at least two multifunctional epoxy resins, preferably, one of which is an epoxy novolac resin having epoxy functionality of greater than one. The second epoxy resin is a non-novolac multifunctional epoxy resin, preferably, tetra- or tri-functional epoxy resin (i.e. epoxy resin having three or four or epoxy functional groups per molecule).

Suitable epoxy novolac resins include polyglycidyl derivatives of phenol-formaldehyde novolacs or cresol-formaldehyde novolacs having the following chemical structure (Structure I):

Structure I

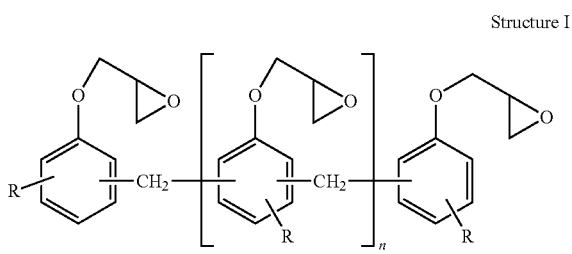

wherein n=0 to 5, and R=H or $CH_3$. When R=H, the resin is a phenol novolac resin. When R=$CH_3$, the resin is a cresol novolac resin. The former is commercially available as DEN 428, DEN 431, DEN 438, DEN 439, and DEN 485 from Dow Chemical Co. The latter is commercially available as ECN 1235, ECN 1273, and ECN 1299 from Ciba-Geigy Corp. Other suitable novolacs that may be used include SU-8 from Celanese Polymer Specialty Co. In a preferred embodiment, the epoxy novolac resin has a viscosity of 4000-10,000 mPa·s at 25° C. and epoxide equivalent weight (EEW) of 190-210 g/eq.

A suitable tetra-functional epoxy resin is a tetra-functional aromatic epoxy resin having four epoxy functional groups per molecule and at least one glycidyl amine group. As an example, the tetra-functional aromatic epoxy resin may have the following general chemical structure (Structure II), namely tetraglycidyl ether of methylene dianiline:

Structure II

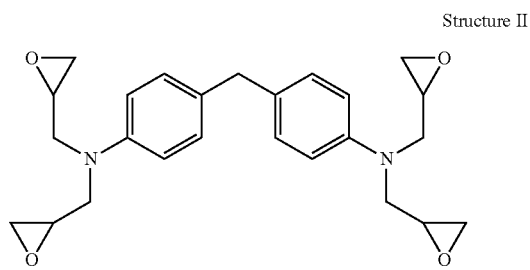 [SMILES: c1cc(N(CC2CO2)CC2CO2)ccc1Cc1ccc(N(CC2CO2)CC2CO2)cc1]

The amine groups in Structure II are shown in the para- or 4,4' positions of the aromatic ring structures, however, it should be understood that other isomers, such as 2,1', 2,3', 2,4', 3,3', 3,4', are possible alternatives. Suitable tetra-functional aromatic epoxy resins include tetraglycidyl-4,4'-diaminodiphenylmethane commercially available as Araldite® MY 9663, MY 9634, MY 9655, MY-721, MY-720, MY-725 supplied by Huntsman Advanced Materials. Examples of tri-functional epoxy resins include triglycidyl ether of aminophenol, e.g. Araldite® MY 0510, MY 0500, MY 0600, MY 0610 supplied by Huntsman Advanced Materials.

In a preferred embodiment, the combination of epoxy novolac resin and multifunctional epoxy resin (tri-functional and/or tetra-functional) makes up at least 15% by weight based on the total weight of the resin film composition. In certain embodiments, the combination of epoxy novolac resin and multifunctional epoxy resin makes up about 30% to about 60% by weight based on the total weight of the resin film composition, and in other embodiments, about 15% to about 25% by weight. The relative amounts of epoxy novolac resin and multifunctional epoxy resin may be varied but it is preferred that the amount of epoxy novolac resin is with the range of 80-100 parts per 100 parts of multifunctional epoxy resin. The combination of epoxy novolac resin and multifunctional epoxy resin at the specified proportion contribute to the desired high $T_g$ and tailored cross-linked density upon curing.

Polymeric Toughening Component

To toughen the resin matrix based on the mixture of multifunctional resins discussed above, one or more polymeric toughening agents are added to the resin film composition. The polymeric toughening agents are selected the group consisting of: (i) a pre-react adduct formed by the reaction of an epoxy resin, a bisphenol, and an elastomeric polymer; (ii) a copolymer of polyether sulfone (PES) and polyether ether sulfone (PEES); and (iii) core-shell rubber particles; and combinations thereof. In a preferred embodiment, a combination of two toughening agents from this group is used. The amount of toughening agent(s), in total, is about 10% to about 20% by weight based on the total weight of the surface film composition.

With regard to the pre-react adduct, suitable epoxy resins include diglycidylether of Bisphenol A, diglycidylether of tetrabromo Bisphenol A, hydrogenated diglycidyl ether of bisphenol A, or hydrogenated diglycidyl ether of bisphenol F. Also suitable are cycloaliphatic epoxies, which include compounds that contain at least one cycloaliphatic group and at least two oxirane rings per molecule. Specific examples include diepoxide of cycloaliphatic alcohol, hydrogenated Bisphenol A (Epalloy™ 5000, 5001 supplied by CVC Thermoset Specialties) represented by the following structure:

Structure III

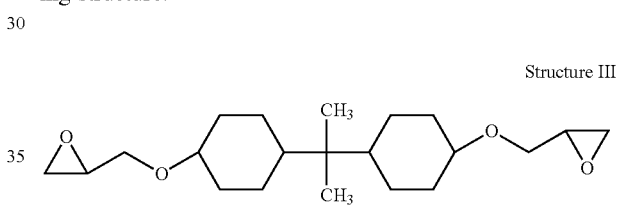

An example of such cycloaliphatic epoxy resin is EPAL-LOY® 5000 (a cycloaliphatic epoxy prepared by hydrogenating bisphenol A diglycidyl ether) available from CVC Thermoset Specialties. Other cycloaliphatic epoxides suitable for use in the pre-react adduct may include EPONEX cycloaliphatic epoxy resins, e.g. EPONEX Resin 1510 supplied by Momentive Specialty Chemicals.

The bisphenol in the pre-react adduct functions as a chain extension agent for the linear or cycloaliphatic epoxy. Suitable bisphenols include bisphenol A, tetrabromo bisphenol A (TBBA), Bisphenol Z, and tetramethyl Bisphenol A (TMBP-A).

Suitable elastomers for forming the pre-react adduct include, but are not limited to, rubbers such as, for example, amine-terminated butadiene acrylonitrile (ATBN), carboxyl-terminated butadiene acrylonitrile (CTBN), carboxyl-terminated butadiene (CTB), fluorocarbon elastomers, silicone elastomers, styrene-butadiene polymers. In an embodiment, elastomers used in the pre-react adduct is ATNB or CTBN.

In one embodiment, the epoxy resin is reacted with the bisphenol chain extension agent and the elastomer polymer in the presence of a catalyst, such as triphenyl phosphine (TPP), at about 300° F. (or 148.9° C.) to chain link the epoxy resins and to form a high viscosity, film-forming, high molecular-weight epoxy resin pre-react adduct. The pre-react adduct is then mixed with the remaining components of the surface film composition.

A second option for the polymeric toughening component is a thermoplastic toughening material which is a copolymer of polyether sulfone (PES) and polyether ether sulfone (PEES) with an average molecular weight of 8,000-14,000. In an embodiment, the toughener is poly(oxy-1,4-phenylenesulfonyl-1,4-phenylene), which has a $T_g$ of about 200° C. as measured by Differential Scanning Calorimetry (DSC).

The third option for the polymeric toughening component is core-shell rubber particles having particle size of 300 nm or less. The core-shell rubber (CSR) particles may be any of the core-shell particles where a soft core is surrounded by a hard shell. Preferred CSR particles are those having a polybutadiene rubber core or butadiene-acrylonitrile rubber core and a polyacrylate shell. CSR particles having a hard core surrounded by a soft shell may also be used, however. The CSR particles may be supplied as a 25-40 weight percent of CSR particles dispersed in a liquid epoxy resin. CSR particles having rubber cores and polyacrylate shells are available commercially from Kaneka Texas Corporation (Houston, Tex.) under the tradenames Kane Ace MX. It is preferred, but not required, that the core-shell rubber particles be added to the surfacing film composition as a suspension of particles in a suitable liquid epoxy resin. Kane Ace MX 411 is a suspension of 25% by weight core-shell rubber particles in MY 721 epoxy resin and is a suitable source of core-shell rubber particles. Kane Ace MX 120, MX 125, or MX 156, which contains 25-37% by weight of the same core-shell rubber particles dispersed in DER 331 resin, is also a suitable source of core-shell rubber particles. Other suitable source of core-shell rubber particles, such as MX 257, MX 215, MX217 and MX 451, may also be used. Another commercial source of core-shell rubber particles is Paraloid™ EXL-2691 from Dow Chemical Co. (methacrylate-butadiene-styrene CSR particles with average particle size of about 200 nm).

Ceramic Microspheres

Ceramic microspheres are added to the resin film composition to improve the surface smoothness of the film. In one embodiment, hollow, ceramic microspheres made of an inert silica-alumina ceramic material are used. The ceramic microspheres may have a crush strength of over 60,000 psi, a dielectric constant of about 3.7-4.6, a softening point in the range of 1000-1100° C. (or 1832-2012° F.), and particle diameters ranging from 0.1 micron to 50 microns, or 1-50 microns. The high softening point of the ceramic microspheres enables them to be nonabsorbent to solvents, nonflammable, and highly resistant to chemicals. Microspheres having diameters ranging from about 0.1 μm to about 20 μm, and preferably from about 1 μm to about 15 μm, have been found to be particularly suitable. An example of commercially available ceramic microspheres which are particularly suitable for use in the present resin film composition are sold by Zeelan Industries, Inc. under the trade name Zeeospheres®, for example, G-200, G210 and W-200. These are hollow, silica-alumina spheres with thick walls, odorless, and light gray in color. In a preferred embodiment, the combination of the multifunctional resins and ceramic microspheres makes up more than 50% by weight, preferably more than 60% by weight, of the resin film composition. In certain embodiments, the amount of ceramic microspheres is at least 20% by weight, preferably at least 25% or at least 30% by weight, based on the total weight of the resin film composition. In some embodiments, the amount of ceramic microspheres may be within the range of 20%-40% by weight, or 25%-35% by weight. In other embodiments, the amount of ceramic microspheres may be within the range of 3%-15% by weight, or 5%-10% by weight.

Curing Agents

The multifunctional epoxide resins may be cured by a variety of latent amine-based curing agents, which are activated at elevated temperatures (e.g. temperature above 150° F. (65° C.)). Examples of suitable curing agents include dicyandiamide (DICY), guanamine, guanidine, aminoguanidine, and derivatives thereof. Compounds in the class of imidazole and amine complexes may also be used. In an embodiment, the curing agent is dicyandiamide. The amine-based curing agent is present in an amount within the range of 1%-5% by weight based on the total weight of the resin film composition.

A curing accelerator may be used in conjunction with the amine-based curing agent to promote the curing reaction between the epoxy resins and the amine-based curing agent. Suitable curing accelerators may include alkyl and aryl substituted ureas (including aromatic or alicyclic dimethyl urea), and bisureas based on toluenediamine or methylene dianiline. One example of bisurea is 4,4'-methylene bis (phenyl dimethyl urea), commercially available as Omicure U-52 or CA 152 from CVC Chemicals, which is a suitable accelerator for dicyandiamide. Another example is 2,4-toluene bis(dimethyl urea), commercially available as Omicure U-24 or CA 150 from CVC Chemicals. The curing accelerator may be present in an amount within the range of 0.5%-3% by weight based on the total weight of the resin film composition.

Flow Control Agents

Inorganic fillers in particulate form (e.g. powder) are added to the resin film composition as a rheology modifying component to control the flow of the resinous composition and to prevent agglomeration therein. Suitable inorganic fillers that may be used in the resin film composition include talc, mica, calcium carbonate, alumina, and fumed silica. In one embodiment, hydrophobic fumed silica (e.g. Cab-O-Sil TS-720) is used as the inorganic filler. The amount of inorganic filler may be within the range of 1%-5% by weight based on the total weight of the resin film composition.

Optional Additives

The resin film composition may further include one or more optional additives which affect one or more of mechanical, electrical, optical, flame resistance, and/or thermal properties of the cured or uncured resin film. The additives may comprise materials that chemically react with the epoxy resins of the composite substrate that is in contact with the resin film or may be unreactive to them. Such additives include, but are not limited to, ultraviolet (UV) stabilizers, pigments/dyes, and conductive materials. When such additives are used, their total amount is less than 5% by weight based on the total weight of the resin film composition.

Examples of UV stabilizers that may be added to the resin composition include butylated hydroxytoluene (BHT); 2-hydroxy-4-methoxy-benzophenone (e.g. UV-9); 2,4-bis(2,4-dimethylphenyl)-6-(2-hydroxy-4-octyloxyphenyl)-1,3,5-triazine (e.g. CYASORB® UV-1164 light absorber); 3,5-di-tert-butyl-4-hydroxybenzoic acid; n-hexadecyl ester (e.g. CYASORB® UV-2908 light stabilizer); Pentaerythritol Tetrakis(3-(3,5-di-tert-butyl-4-hydroxyphenyl)propionate (e.g. IRGANOX 1010). Liquid hindered-amine light stabilizer from Ciba Specialty Chemicals, such as 2-(2H-benzotriazol-2-yl)-4,6-ditertpentylphenol (e.g. TINUVIN 328), Methyl 1,2,2,6,6-pentamethyl-4-piperidyl sebacate (e.g. TINUVIN 292). Decanedioic acid, bis(2,2,6,6-tetramethyl-1-(octyloxy)-4-piperidinyl ester (e.g. TINUVIN 123), may also be used as suitable UV stabilizers. In addition, nano-sized zinc oxide (n-ZnO), e.g. NanoSunGuard 3015, and titanium oxide nanoparticles (n-TiO2) may also be used as UV stabilizers.

Pigments and/or dyes known in the art for adding color to resinous systems may be added to the resin film composition. Examples of pigments and/or dyes include, but are not limited to, red iron oxide, green chromium, carbon black, and titanium oxide. In an embodiment, titanium oxide (white) pigment is added the resin film composition. In another embodiment, carbon black pigment is added.

Conductive materials in particulate form, e.g. particles or flakes, may also be added to the resin film composition to impart electrical conductivity to the final resin film. It has been discovered that the combination of the metal layer (or foil) and resin film(s) having conductive particles or flakes distributed therein results in conductivity property that is similar to pure metal layer. For example, a surface resistivity of less than 20 mΩ, in some cases 5 mΩ, is achievable for a multilayered structure having one or two conductive resin film(s) combined with a metal layer/foil. Examples of suitable conductive materials include metals such as silver, gold, nickel, copper, aluminum, bronze, and alloys thereof, in the form of flakes or particles. Carbon-based materials, such as carbon nano-tubes (single-wall nano tubes or multi-wall nano tubes), carbon nano-fibers, and graphene may also be used as conductive additives to impart the electrical conductivity to the resin film. The nano-fibers may have diameters ranging from 70 to 200 nanometers and a length of about 50-200 microns. The nano-tubes may have an outer diameter of about 10 nanometers, length of about 10,000 nanometers, and an aspect ratio (L/D) of about 1000. In addition, conductive additives may also include carbon black particles (such as Printex XE2 from DeGussa).

In certain embodiments, the mutilayer conductive surfacing materials with the metal layer/foil combined with conductive resin films (having conductive additives dispersed therein) are capable of exhibiting metal-like conductivity that is 1-2 magnitude higher than that of conductive resin films alone. As such, the multilayered conductive surfacing material provides 3-dimensionally uniform, high conductivity just like metal, which would bring in significant improvement for composite EME protection in both LSP and EMI shielding.

Tables 1A and 1B show various embodiments for the resin film composition.

TABLE 1A

| Components | Embodiments | | | |
|---|---|---|---|---|
| | 1 | 2 | 3 | 4 |
| Multifunctional Epoxy Resins | | | | |
| Epoxy phenol novolac resin (e.g., DEN 439, DEN 438L, DEN 431) | 5-15% | 5-15% | 20-40% | 40-55% |
| Tetraglycidylether methylenedianiline (e.g., MY 9663, MY 9655, 9634, 721) | 5-15% | 5-15% | 20-40% | |
| Triglycidyl ether of aminophenol (e.g. MY 0510, 600, 610) | | | | 3-10% |
| Toughening Agent | | | | |
| Pre-react adduct of Bisphenol A, epoxy, and elastomer | 5-15% | 5-15% | | |
| Acrylonitrile butadiene polymer | 0.5-2% | 0.5-2% | 0.5-2% | |
| CTBN or CTB elastomer | 0.5-2% | 0.5-2% | 0.5-2% | |
| CSR particles (25 wt %) dispersed in Bisphenol A diglycidyl ether (e.g. MX 120, MX 125) | | | | |
| CSR particles | | | 3-6% | 3-6% |
| PES-PEES co-polymer | 0.5-5% | 0.5-5% | 0.5-5% | |
| Curing agents | | | | |
| Dicyandiamide | 0.5-5% | 0.5-5% | | 0.5-5% |
| Bisureas | 0.5-3% | 0.5-3% | | 0.5-3% |
| BF₃ | | | | |
| 4,4'-DDS | | | 5-30% | |
| Inorganic fillers | | | | |
| Ceramic microspheres (e.g. Zeeospheres G-200) | 5-15% | 20-40% | 20-40% | 20-40% |
| Flow control agent | | | | |
| Fumed silica | 0.5-3% | 0.5-5% | 0.5-5% | 0.5-5% |
| UV stabilizers/additives | | | | |
| Butylated Hydroxytoluene (BHT) | | 0.5-3% | | |
| 2-hydroxy-4-methoxy benzophenone (e.g. UV-9) | | 0.5-3% | | |
| Nano-sized ZnO | | | | 2-6% |
| Phenolic antioxidants | 0.5-3% | | 0.5-3% | 0.5-3% |
| Triazine or triazole UV absorbers | 0.5-3% | | 0.5-3% | 0.5-3% |
| Liquid hindered amines | 0.5-3% | | 0.5-3% | |
| Conductive Additives | | | | |
| Silver flakes, copper flakes, Ag—Cu flakes | 40-70% | | 40-70% | |
| Carbon black particles | | | | |
| Carbon-based nanoparticles (e.g. carbon nano-tubes, carbon nano-fibers) | | | | |
| Pigments | | | | |
| TiO₂ | 0.5-5% | 0.5-5% | 0.5-5% | 0.5-5% |

TABLE 1B

| Components | Embodiments | | | |
|---|---|---|---|---|
| | 5 | 6 | 7 | 8 |
| Multifunctional Epoxy Resins | | | | |
| Epoxy phenol novolac resin (e.g., DEN 439, DEN 438L, DEN 431) | 20-40% | 20-40% | 20-30% | 20-40% |
| Tetraglycidylether methylene dianiline (e.g., MY 9663, MY 9655, 9634, 721) | 20-40% | | | |
| Triglycidyl ether of aminophenol (e.g. MY 0510, 600, 610) | | | | |
| Toughening Agent | | | | |
| Pre-react adduct of Bisphenol A, epoxy, and elastomer | 10-20% | | 5-15% | |
| Acrylonitrile butadiene polymer | 0.5-2% | | 0.5-2% | |
| CTBN or CTB elastomer | 0.5-2% | | 0.5-2% | |
| CSR particles (25 wt %) dispersed in Bisphenol A diglycidyl ether (e.g. MX 120, MX 125) | | 20-40% | 10-25% | 10-25% |
| CSR particles | | | | |
| PES-PEES co-polymer | | | | |
| Curing agents | | | | |
| Dicyandiamide | 0.5-5% | | 0.5-5% | 0.5-5% |
| Bisureas | 0.5-3% | | 0.5-3% | 0.5-3% |
| BF₃ | | 0.5-1% | | |
| 4,4'-DDS | | 5-30% | | |

TABLE 1B-continued

| Components | Embodiments | | | |
|---|---|---|---|---|
| | 5 | 6 | 7 | 8 |
| Inorganic fillers | | | | |
| Ceramic microspheres (e.g. Zeeospheres G-200) | 10-30% | 20-40% | 20-40% | 20-40% |
| Flow control agent | | | | |
| Fumed silica | 0.5-5% | 0.5-5% | 0.5-5% | 0.5-5% |
| UV stabilizers/additives | | | | |
| Butylated Hydroxytoluene (BHT) | | | | 0.5-3% |
| 2-hydroxy-4-methoxy benzophenone (e.g. UV-9) | | | | 0.5-3% |
| Nano-sized ZnO | | | | |
| Phenolic antioxidants | | | 0.5-3% | 0.5-3% |
| Triazine or triazole UV absorbers | | | 0.5-3% | 0.5-3% |
| Liquid hindered amines | | | 0.5-3% | |
| Conductive Additives | | | | |
| Silver flakes, copper flakes, Ag—Cu flakes | | | | |
| Carbon black particles | | | 2-5% | 2-5% |
| Carbon-based nanoparticles (e.g. carbon nano-tubes, carbon nano-fibers) | | 1-3% | 1-3% | |
| Pigments | | | | |
| $TiO_2$ | 0.5-5% | | 0.5-5% | |

In one embodiment, the resin film composition has the following formulation, in weight percentages based on the total weight of the composition: 20%-25% epoxy phenol novolac resin; 20%-25% tetra-functional epoxy resin; 10%-15% pre-react adduct, 1%-3% PES-PEES copolymer, 25%-35% ceramic microspheres; 1%-5% latent amine-based curing agent; 0.5%-3% curing accelerator; 1%-3% inorganic fillers; and optionally 0.1-1% color pigment.

In another embodiment, the resin film composition has the following formulation, in weight percentages based on the total weight of the composition: 5%-15% epoxy phenol novolac resin; 5%-15% tetra-functional epoxy resin; 10%-20% pre-react adduct, 1%-3% PES-PEES copolymer, 25%-35% ceramic microspheres; 1%-5% latent amine-based curing agent; 0.5%-3% curing accelerator; 1%-3% inorganic fillers; and optionally 45%-70% conductive additives, such as silver flakes or silver-copper flakes, orcarbon-based nano-sized materials discussed above.

The components of the resin film composition may be added to a mixing vessel equipped for mixing, heating, and/or cooling the components. Furthermore, one or more organic solvents may also be added to the mixture, as necessary, to facilitate the mixing of the components. Examples of such solvents may include, but are not limited to, methyl ethyl ketone (MEK), acetone, dimethylacetamide, and N-methylpyrrolidone. A resin film is subsequently formed from the resin film composition using conventional film-forming processes.

To facilitate the handling of the resin film, the resin film composition is applied onto a carrier. Non-limiting examples of the carrier may include fibrous sheets made of thermoplastic polymer fibers or carbon fibers, non-woven mats, random mats, knit carriers, metal coated carbon veils, and the like. Examples of non-woven mats, woven or knit backings may include carbon mats, polymer mats, and metal coated carbon, glass, or polymer glass veils. The non-woven mat, woven or knit backing may be coated with copper, aluminum, silver, nickel, and alloys thereof. Upon curing, the resulting cured resin film exhibits high cross-linked density, a high glass transition temperature ($T_g$) of ≥180° C. as measured by DSC, a pencil hardness of 7H or higher according to ASTM D-3363. These properties enable the cured resin film to exhibit high resistance to conventional paint strippers (e.g. benzyl alcohol-based paint stripping solutions), as well as UV radiation and micro-cracking. It has been found that, after being in contact with a benzyl alcohol-based paint stripping solution for 7 days at ambient temperature (20° C.-25° C.), the surfacing film exhibits less than 0.5% fluid absorption, and the pencil hardness is not reduced by more than 2H pencil grades. Furthermore, the cured resin film has been found to exhibit a micro-crack density of less than 0.3 cracks/in$^2$ after being subjected to a 2000×thermal cycling testing between −55° C. and 71° C. The cured resin film further exhibits high adherence to paint coatings normally used for painting aerospace structures. The adherence of the resin film to the paint coating is such that the painted surface exhibits substantially 0% paint loss after being subjected to a paint adhesion test in accordance with ASTM D3359 under a dry condition or wet condition (after immersion in de-ionized water at 75° F. for 7 days), with or without being subjected to 1000 KJ/m$^2$ UVA radiation exposure.

EXAMPLES

The following examples serve to give specific embodiments of the conductive surfacing materials according to the present disclosure but are not meant to limit the scope of the present disclosure in any way.

Nine resin films were prepared based on the formulations (1-9) shown in Table 2. All amounts are in weight percentage.

TABLE 2

| Components | Concentrations (wt %) | | | | | | | | |
|---|---|---|---|---|---|---|---|---|---|
| | 1 | 2 | 3 | 4 | 5 | 6 | 7 | 8 | 9 |
| Epoxy phenol novolac resin | | 21.5 | 23.4 | 6.9 | 8.3 | 9.0 | 6.9 | | |
| Tetraglycidyl 4,4'-diaminodiphenylmethane | 2.5 | 23.7 | 25.8 | 9.6 | 11.6 | 12.6 | 9.6 | 5.5 | 5.2 |
| Pre-react adduct of Bisphenol A, epoxy, and elastomer | 18 | 14.1 | 6.2 | 11.4 | 13.8 | 14.6 | 11.4 | 46.1 | 43.4 |
| Bisphenol A diglycidyl ether with CSR particles (25 wt %) | 7 | | | | | | | 11.6 | 10.6 |
| PES-PEES co-polymer | 1 | 1.4 | 1.9 | 0.6 | 0.8 | 0.9 | 0.6 | | |
| Dicyandiamide (DICY) | 1 | 3.4 | 3.7 | 1.4 | 1.6 | 1.8 | 1.4 | 2.3 | 2.17 |
| 4,4'-Methylene bis(phenyldimethylurea) | 1 | 1.7 | 1.9 | 0.6 | 0.8 | 0.9 | 0.6 | 2.3 | 2.17 |

TABLE 2-continued

| Components | \multicolumn{9}{c}{Concentrations (wt %)} | | | | | | | | |
|---|---|---|---|---|---|---|---|---|---|
| | 1 | 2 | 3 | 4 | 5 | 6 | 7 | 8 | 9 |
| Ceramic microspheres | 9 | 31.1 | 33.8 | 4.6 | 5.5 | 6 | 4.6 | 23.1 | 21.7 |
| Butylated Hydroxytoluene (BHT) | 0.5 | | | | | | | | 1 |
| 2-hydroxy-4-methoxy-benzophenone | 0.5 | | | | | | | | 1 |
| Pentaerythritol tetrakis(3-(3,5-di-tert-butyl-4 hydroxyphenyl) propionate | | | | | | 1 | | | |
| hydroxyphenylbenzotriazole | | | | | | 1 | | | |
| Fumed silica | 1.2 | 2.5 | 2.7 | 1 | 1.5 | 1 | 1 | 3.3 | 3.86 |
| Silver flakes | 56 | | | 63 | 55 | 50 | | | |
| Ag—Cu flakes | | | | | | | 63 | | |
| Carbon black | | | | | | | | | 3.5 |
| TiO$_2$ pigment | 2.3 | 0.6 | 0.6 | 0.9 | 1.1 | 1.2 | 0.9 | 5.8 | 5.4 |
| Total | 100 | 100 | 100 | 100 | 100 | 100 | 100 | 100 | 100 |

Each resin film was prepared by adding the components disclosed in Table 2 into a mixing vessel and mixing the components using a high-speed shear lab mixer. The epoxy resins were added first. MEK was added as a solvent to the epoxy resin mixture, as necessary, in order to adjust the rheology and solid content of the composition. Subsequently, the toughening agent(s) (pre-react adduct and/or PES-PEES co-polymer) was added to the epoxy resins. In certain surfacing films (Formulations 4-7), conductive additives (silver flakes or Ag—Cu flakes) were also added to the mixing vessel. Ceramic microspheres, fumed silica, and UV stabilizers (in some formulations) were further added to the mixing vessel. MEK solvent was added, as necessary, to control the viscosity of above mix to about 80 wt. % solids and the components of the composition were mixed for about 50-70 minutes at about 1000-3000 rpm. The temperature of the composition was kept below about 160° F. Additional MEK was added, as necessary, to inhibit the mixture from climbing the mixing shaft.

The mixture was subsequently cooled to below about 120° F. and the curing agents (dicyandiamide (Dicy) and Bisurea) were added to the composition. The composition was then mixed until approximately homogenous. The temperature of the mixture, during addition of the curing agents, was maintained below about 130° F.

To form surfacing resin films from the above compositions, each composition was strained, de-aired, and deposited as a film. Straining was performed through filtration media EP-15. De-airing was performed such that the solid content of the composition was about 80 wt. %. The strained and de-aired composition was then coated as a film having a film weight of about 0.020-0.030 psf by a film coater, and then dried so as to achieve less than about 1% by weight volatiles. A selected non-woven polyester or glass random mat carrier or conductive carrier was pressed into the resin film under light pressure to embed the carrier to the film.

To form the multilayer, conductive surfacing material, the resin films formed from the resin compositions of Table 2 were combined various metal foils to form a tri-layered structure (as shown in FIG. 1) through a film/foil lamination process under appropriate temperature and pressure. Composite panels were then fabricated by combining the multilayer conductive surfacing material with a prepreg layup. For each panel, the tri-layered conductive surfacing material was placed on a tool, followed by laying up of prepreg plies (CYCOM 5276-1 from Cytec Industries Inc., carbon fibers/epoxy based prepregs) to form a prepreg layup. The prepreg layup with the conductive surfacing material was then cured at a temperature of about 350° F. for 2 hours under 80 psi in an autoclave.

Surfacing Film Evaluation

The glass transition temperature ($T_g$) of the cured resin films was determined by using either a modulated DSC (TA 2910) or a thermal mechanical analyzer (TMA 2940, TA Instruments) under nitrogen at ramp of 10° C./min within 30° C.-230° C. temperature range.

Composite Laminate Panel Evaluation

The composite panels surfaced with the multi-layered, conductive surfacing material were inspected for surface appearance defects (pits, pin holes). Then the composite panels were evaluated for its paint stripper resistance, dry and wet paint adhesion with or without UV exposure, and micro-crack resistance.

Paint Stripper Resistance Testing

Paint stripper resistance of unpainted, surfaced composite panels (2"×2" specimen size, with 0.15 mm thickness) were measured by measuring the paint stripper fluid uptake and surface pencil hardness change over the immersion period (up to 168 hours at ambient room temperature) of benzyl alcohol-based paint stripper solution (Cee Bee 2012A available from McGean or Turco 1270-6 available from Henkel) used for aerospace composite structure paint-stripping process. The weight of each test panel was measured before and after paint stripper soak at interval of 24 hours, 48 hours and up to 168 hours (7 days). The paint stripper fluid uptake (weight change over immersion time, expressed in wt. %) of the tested panel was measured at same test intervals up to 168 hours (7 days) immersion.

The surface of each unpainted test panel was immersed the benzyl alcohol-based paint stripper solution for up to 168 hours at ambient room temperature, and then tested for pencil hardness change during the immersion period according to ASTM D3363. ASTM D3363 refers to a Standard Test Method for determining the surface hardness of clear and pigmented organic coating film on a substrate. The pencil hardness scale is as follows: 6B (softest), 5B, 4B, 3B, 2B, B, HB, F, H, 2H, 3H, 4H, 5H, 6H, 7H, 8H, 9H (hardest). The pencil hardness of the test panel was measured before and after soaking in the paint stripper at interval of 24 hours, 48 hours and up to 168 hours (7 days). Pencil hardness that changes more than 2H level upon 24 hour immersion is not considered as having good paint stripper resistance.

Dry and Wet Paint Adhesion with or without UV Exposure

Dry and wet scribe paint adhesion of painted composite panels (in the form of 3"×6" specimen size, with 0.15 mm thickness) surfaced with the multilayered conductive surfacing film, with or without UV exposure prior to painting, was measured according to ASTM D3359. ASTM D3359 refers to a Standard Test Method for assessing the surface adhesion of coating films to substrates by applying and removing pressure-sensitive tape over cuts made in the film (cross-hatch scribe tape test). The cured test panels were exposed to zero (without UV), 200 kJ/m$^2$ or 1000 kJ/m$^2$ ultraviolet (UV-A) radiation in accordance with AATCC Test Method 16, Option 3. Instrument used for UV testing is a Xeno Weather-o-meter, such as Atlas CI3000 Fadeo Meter. Each test panel surface was prepared (cleaned, with and without sanding) and applied with an exterior decorative paint coating used in aerospace painting (epoxy paint primer followed by a polyurethane based top-coat). Subsequently, dry paint adhesion test was conducted in accordance with ASTM D3359. For conducting wet paint adhesion, the UV exposed test panels were painted and then immersed in de-ionized water at 75° F. for 7 days. Wet paint adhesion test was then conducted in accordance with ASTM D3359.

Electrical Conductivity Measurements

The test panels with conductive surfacing material were cut to form test coupons of about 6×5 inches and their electrical conductivity or surface resistivity (in Ohm/square, or milliohm/square) was measured using a four-point probe AVO® Ducter® DLRO10× Digital Low Resistivity Ohmmeter.

Tables 3 and 4 show the surface properties and test results for the test panels surfaced with tri-layer surfacing materials (resin film/metal foil/resin film) based on the resin film formulations from Table 2 and a solid metal foil (copper or aluminum) as specified in the Tables 3 and 4.

TABLE 3

| | | Test Panel# | | | | |
|---|---|---|---|---|---|---|
| | | 1 | 2 | 5 | 6 | 7 |
| Resin Film # (from Table 2) | | Resin 1 | Resin 1 | Resin 4 | Resin 4 | Resin 4 |
| Solid Metal Foil (Cu or Al) | | Cu Foil | Cu Foil | Cu Foil | Cu Foil | Al Foil |
| Foil Thickness (μm) | | 35 μm | 5 μm | 35 μm | 5 μm | 18 μm |
| Properties | | | | | | |
| $T_g$ (° C.) of resin film | | 117 | 117 | 180 | 180 | 180 |
| Surface Resistiviy of resin film (mΩ/sq) | | 0.93 | 3.6 | 1.3 | 2.9 | 25 |
| Foil Resistivity (mΩ/sq) | | 1.0 | 2.8 | 1.2 | 2.4 | 2.5 |
| Paint stripper resistance | Day 0 | 0 | 0 | 0 | 0 | 0 |
| | Day 1 | 0.33 | 0.35 | 0.19 | 0.20 | 0.21 |
| | Day 2 | 0.55 | 0.57 | 0.23 | 0.24 | 0.25 |
| | Day 3 | 0.71 | 0.75 | 0.27 | 0.29 | 0.28 |
| | Day 4 | 0.90 | 0.93 | 0.31 | 0.33 | 0.35 |
| | Day 5 | 1.11 | 1.20 | 0.42 | 0.41 | 0.43 |
| | Day 7 | 1.47 | 1.49 | 0.48 | 0.49 | 0.48 |
| Surface pencil hardness | Day 0 | 9H | 9H | 9H | 9H | 9H |
| | Day 1 | 9H | 9H | 9H | 9H | 9H |
| | Day 2 | 9H | 9H | 9H | 9H | 9H |
| | Day 3 | 9H | 9H | 9H | 9H | 9H |
| | Day 4 | 9H | 9H | 9H | 9H | 9H |
| | Day 5 | 7H | 6H | 9H | 9H | 9H |
| | Day 7 | 4H | 3H | 9H | 9H | 9H |
| Paint adhesion | | | | | | |
| Dry scribe w/UV | 7 days | 10+ | 10+ | 10+ | 10+ | 10+ |
| Wet scribe w/UV | 7 days | 10+ | 10+ | 10+ | 10+ | 10+ |
| Dry scribe w/o UV | 7 days | 10+ | 10+ | 10+ | 10+ | 10+ |
| Wet scribe w/o UV | 7 days | 10+ | 10+ | 10+ | 10+ | 10+ |
| Wet scribe w/o UV | | 10+ | 10+ | 10+ | 10+ | 10+ |

TABLE 4

| | | Test Panel# | | | |
|---|---|---|---|---|---|
| | | 3 | 4 | 8 | 9 |
| Resin Film # (from Table 2) | | Resin 2 | Resin 2 | Resin 8 | Resin 8 |
| Solid Metal Foil (Cu or Al) | | Cu Foil | Cu Foil | Cu Foil | Cu Foil |
| Foil Thickness (μm) | | 35 μm | 5 μm | 35 μm | 5 μm |
| Properties | | | | | |
| $T_g$ (° C.) of resin film | | 189 | 189 | 145 | 143 |
| Foil resistivity (mΩ/sq) | | 0.92 | 3 | 1.4 | 2.4 |
| Paint stripper resistance | Day 0 | 0 | 0 | 0 | 0 |
| | Day 1 | 0.20 | 0.21 | 0.54 | 0.38 |
| | Day 2 | 0.25 | 0.26 | 0.85 | 0.80 |
| | Day 3 | 0.29 | 0.31 | 0.98 | 1.04 |
| | Day 4 | 0.33 | 0.36 | 1.12 | 1.45 |
| | Day 5 | 0.39 | 0.40 | 1.32 | 1.63 |
| | Day 7 | 0.44 | 0.45 | 1.65 | 1.82 |
| Surface pencil hardness | Day 0 | 9H | 9H | 9H | 9H |
| | Day 1 | 9H | 9H | 9H | 9H |
| | Day 2 | 9H | 9H | 9H | 9H |
| | Day 3 | 9H | 9H | 8H | 8H |
| | Day 4 | 9H | 9H | 7H | 6H |
| | Day 5 | 9H | 9H | 4H | 3H |
| | Day 7 | 9H | 9H | HB | HB |
| Paint adhesion | | | | | |
| Dry scribe w/UV | 7 days | 10+ | 10+ | 10+ | 10+ |
| Wet scribe w/UV | 7 days | 10+ | 10+ | 10+ | 10+ |
| Dry scribe w/o UV | 7 days | 10+ | 10+ | 10+ | 10+ |
| Wet scribe w/o UV | 7 days | 10+ | 10+ | 10+ | 10+ |
| Wet scribe w/o UV | | 10+ | 10+ | 10+ | 10+ |

As shown in Tables 3 and 4, the test panels exhibited excellent paint stripper resistance and high surface hardness (>7H). These panels also exhibited excellent paint adhesion (10+ means 0% paint loss) under various test conditions (dry and wet, with or without UV exposure).

Referring to Table 3, composite panels surfaced with tri-layer conductive surfacing materials (test panels 1-2, and 5-7) have been found to exhibit unexpected metal-like conductivity (less than 5 mΩ/sq), which is 1 to 2 magnitude higher than that of conductive resin films alone (without metal foil). As such, the tri-layer conductive surfacing materials provide three-dimensionally uniform, high conductivity just like metals. The metal-like conductivity of these tri-layer conductive surfacing materials enables them to provide good LSP protection and EMI shielding.

Micro-Crack Resistance Testing

The test panels disclosed in Tables 3 and 4 were painted, and the resistance to micro-cracking of painted test panels (in the form of 4"×6" specimen size, with 0.15 mm thickness) was also measured. The painted test panels were subjected to thermal cycling between −55° C. and 71° C. up to 2000× cycles. The surface of each test panel after thermal cycling was examined under microscope for micro-crack occurrence after being exposed to 400×, 800×, 1200×, 1600× and 2000× thermal cycles. The crack-density (number of surface paint cracks shown in the test panel size area) is used to measure the micro-crack resistance of the surfaced composite test panel. The maximum length of crack should be less than 0.1 inch. The micro-crack test results after 2000× thermal cycles are shown in Table 5.

TABLE 5

Thermal Cycling Test Results

| | Test Panel | | | | | | | | |
|---|---|---|---|---|---|---|---|---|---|
| | 1 | 2 | 3 | 4 | 5 | 6 | 7 | 8 | 9 |
| Resin Film # (from Table 2) | Resin 1 | Resin 1 | Resin 2 | Resin 2 | Resin 4 | Resin 4 | Resin 4 | Resin 8 | Resin 8 |
| Solid Metal Foil type (Cu or Al) - Thickness (μm) | Cu Foil (35 μm) | Cu Foil (5 μm) | Cu Foil (35 μm) | Cu Foil (5 μm) | Cu Foil (35 μm) | Cu Foil (5 μm) | Al Foil (18 μm) | Cu Foil - (35 μm) | Cu Foil (5 μm) |
| Crack density (cracks/in²) | 0.10 | 0.15 | 0.10 | 0 | 0 | 0.1 | 0.18 | 0.20 | 0.23 |

As shown in Table 5, test panels surfaced with multilayer, conductive surfacing materials show good micro-crack resistance, with cracking density of less than 0.3 cracks/in².

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "approximately" and "about" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to approximately 25 wt %, or, more specifically, approximately 5 wt % to approximately 20 wt %", is inclusive of the endpoints and all intermediate values of the ranges, for example, "1 wt % to 10 wt %" includes 1%, 2%, 3%, etc.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of fabricating a composite structure comprising:
    forming a surfacing material in the form of a tape comprising:
        (a) an electrically conductive layer having two opposite surfaces and a thickness of less than 3 mils and resistivity less than 10 mΩ;
        (b) a resin film formed on at least one surface of the conductive layer, wherein the resin film is formed from a curable composition comprising:
            an epoxy novolac resin having the following chemical structure:

where n = 0 to 5, and R = H or CH$_3$;
            a non-novolac tri-functional or tetra-functional epoxy resin;
            ceramic microspheres;
            a latent amine-based curing agent;
            particulate inorganic fillers; and
            a toughening component comprising:
                (i) a pre-react adduct formed by the reaction of an epoxy resin, a bisphenol, and an elastomer and (ii) at least one of a copolymer of polyether sulfone (PES) and polyetherether sulfone (PEES) and core-shell rubber (CSR) particles;
    laying up prepreg tapes in an automated placement process to form a composite structure, each prepreg tape comprising reinforcing fibers impregnated with a matrix resin;
    incorporating the surfacing material into the automated placement process so that the resin film of the surfacing material forms an outermost layer in the final composite structure; and
    curing the final composite structure, wherein the cured resin film of the surfacing material exhibits a pencil hardness of 7H to 9H according to ASTM D-3363.

2. The method of claim 1, wherein each of the prepreg tapes and the surfacing material has a width within the range of 0.125 in -1.5 in.

3. The method of claim 1, wherein each of the prepreg tapes and the surfacing material has a width within the range of 6-12 in.

4. The method of claim 1, wherein the conductive layer in the surfacing material is a metal foil having a thickness within the range of 3 μm-5 μm.

5. The method of claim 1, wherein the resin film in the surfacing material further comprises conductive particles or flakes distributed throughout the resin film, and the conductive particles or flakes are formed of a conductive material selected from: silver, gold, aluminum, copper, bronze, carbon, and combinations thereof.

6. The method of claim 1, wherein said resin is formed on each of the opposite surfaces of the conductive layer such that the conductive layer is sandwiched between two resin films.

7. The method of claim 1, wherein the resin film composition has the following formulation, in weight percentages based on the total weight of the composition: 20%-25% epoxy novolac resin; 20%-25% non-novolac tetra-functional epoxy resin; 10%-15% pre-react adduct, 1%-3% PES-PEES copolymer, 25%-35% ceramic microspheres; 1%-5% latent amine-based curing agent; 0.5%-3% curing accelerator; 1%-3% inorganic fillers; and optionally 0.1-1% color pigment.

* * * * *